(12) United States Patent
Qu et al.

(10) Patent No.: US 12,028,962 B2
(45) Date of Patent: Jul. 2, 2024

(54) THERMAL MANAGEMENT OF CIRCUIT BOARDS

(71) Applicant: Micron Technology, Inc., Boise, ID (US)

(72) Inventors: Xiaopeng Qu, Boise, ID (US); Hyunsuk Chun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 17/819,716

(22) Filed: Aug. 15, 2022

(65) Prior Publication Data

US 2022/0394878 A1    Dec. 8, 2022

Related U.S. Application Data

(63) Continuation of application No. 16/941,212, filed on Jul. 28, 2020, now Pat. No. 11,419,239.

(60) Provisional application No. 63/043,712, filed on Jun. 24, 2020.

(51) Int. Cl.
| | |
|---|---|
| *H05K 1/02* | (2006.01) |
| *H01L 23/467* | (2006.01) |
| *H01L 23/473* | (2006.01) |
| *H01R 12/71* | (2011.01) |
| *H01R 12/72* | (2011.01) |
| *H01R 12/73* | (2011.01) |
| *H05K 7/20* | (2006.01) |
| *H05K 3/36* | (2006.01) |

(52) U.S. Cl.
CPC ......... *H05K 1/0203* (2013.01); *H01L 23/473* (2013.01); *H01R 12/724* (2013.01); *H05K 7/20145* (2013.01); *H01L 23/467* (2013.01); *H01R 12/716* (2013.01); *H01R 12/737* (2013.01); *H05K 7/20163* (2013.01); *H05K 7/20309* (2013.01); *H05K 7/20318* (2013.01); *H05K 7/20327* (2013.01); *H05K 7/205* (2013.01)

(58) Field of Classification Search
CPC .......... H05K 7/20145; H05K 7/20163; H05K 7/205; H05K 1/0203; H05K 1/0201; H05K 1/0272; G06F 1/20; G06F 1/203; H01L 23/467; H01R 12/724
See application file for complete search history.

(56) References Cited

U.S. PATENT DOCUMENTS

| | | | |
|---|---|---|---|
| 6,223,810 B1 * | 5/2001 | Chu | ..................... F28D 15/0266 257/E23.099 |
| 6,567,271 B2 | 5/2003 | Stone et al. | |
| 6,711,021 B1 * | 3/2004 | Morris | ............... H05K 7/20154 361/721 |

(Continued)

*Primary Examiner* — Zachary Pape
(74) *Attorney, Agent, or Firm* — Perkins Coie LLP

(57) ABSTRACT

A semiconductor component system includes a motherboard and a cooling system mounted to the motherboard. The cooling system includes sidewalls projecting from the motherboard. A sub-motherboard extends between the sidewalls and is spaced apart from the motherboard. The sidewalls and the sub-motherboard define a cooling channel over the motherboard. A connector is attached to the sub-motherboard and is configured to receive a semiconductor device daughterboard. The connector has contacts to electrically couple the semiconductor device daughterboard to the sub-motherboard.

15 Claims, 7 Drawing Sheets

(56) References Cited

U.S. PATENT DOCUMENTS

| | | | |
|---|---|---|---|
| 7,068,515 B2 | 6/2006 | Harris et al. | |
| 7,327,569 B2 * | 2/2008 | Belady | G06F 1/189 |
| | | | 257/E23.102 |
| 7,336,490 B2 | 2/2008 | Harris et al. | |
| 7,539,026 B2 * | 5/2009 | Finnerty | H05K 1/141 |
| | | | 361/810 |
| 9,298,228 B1 | 3/2016 | Abhyankar et al. | |
| 9,485,851 B2 * | 11/2016 | Ellis | G06F 1/203 |
| 2013/0094139 A1 * | 4/2013 | Campbell | H05K 7/20772 |
| | | | 361/699 |
| 2021/0410278 A1 | 12/2021 | Qu et al. | |

* cited by examiner

THERMAL MANAGEMENT OF CIRCUIT BOARDS

CROSS-REFERENCE TO RELATED APPLICATION

This application is a continuation of U.S. patent application Ser. No. 16/941,212, filed Jul. 28, 2020, now U.S. Pat. No. 11,419,239, which claims the benefit of U.S. Provisional Patent Application No. 63/043,712, filed on Jun. 24, 2020, which are incorporated by reference herein in their entirety.

TECHNICAL FIELD

The present technology is directed to thermal management of semiconductor devices attached to circuit boards. More particularly, some embodiments of the present technology relate to apparatus and techniques for cooling modular components on circuit boards.

BACKGROUND

As manufacturing and design processes improve, computing components have become smaller and more powerful. It is desirable to position components on circuit boards, as well as circuit boards for module-type devices, as closely as possible to allow for a smaller-sized product and/or to provide increased capability within the product. Some components, such as a power management integrated circuit, generate significant heat. The heat can become trapped between components and circuit boards, which can damage some of the components or cause system degradation. As a result, the heat can become a limiting factor in component design and system design.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments for cooling circuit boards mounted in close proximity to each other are described below. In one example, a heatsink separates one or more semiconductor device daughterboards from the motherboard. The heatsink can include a sub-motherboard and vertical walls. The heatsink forms a cooling channel that allows a cooling fluid (e.g., air) to flow between the motherboard and the sub-motherboard. The cooling channel can be open or can have fins therein to provide increased surface area that may improve heat transfer as air flows through the cooling channel. The daughterboards can be connected to the sub-motherboard with connectors formed of a heat-conducting material to further facilitate heat transfer from the daughterboards to the heatsink. In another example, a closed-system can circulate a cooling fluid through the cooling channel. Therefore, different cooling mediums (e.g., air or another cooling fluid, such as a liquid) can be moved through the cooling channel to manage the temperatures of the circuit boards.

Figure 1A:
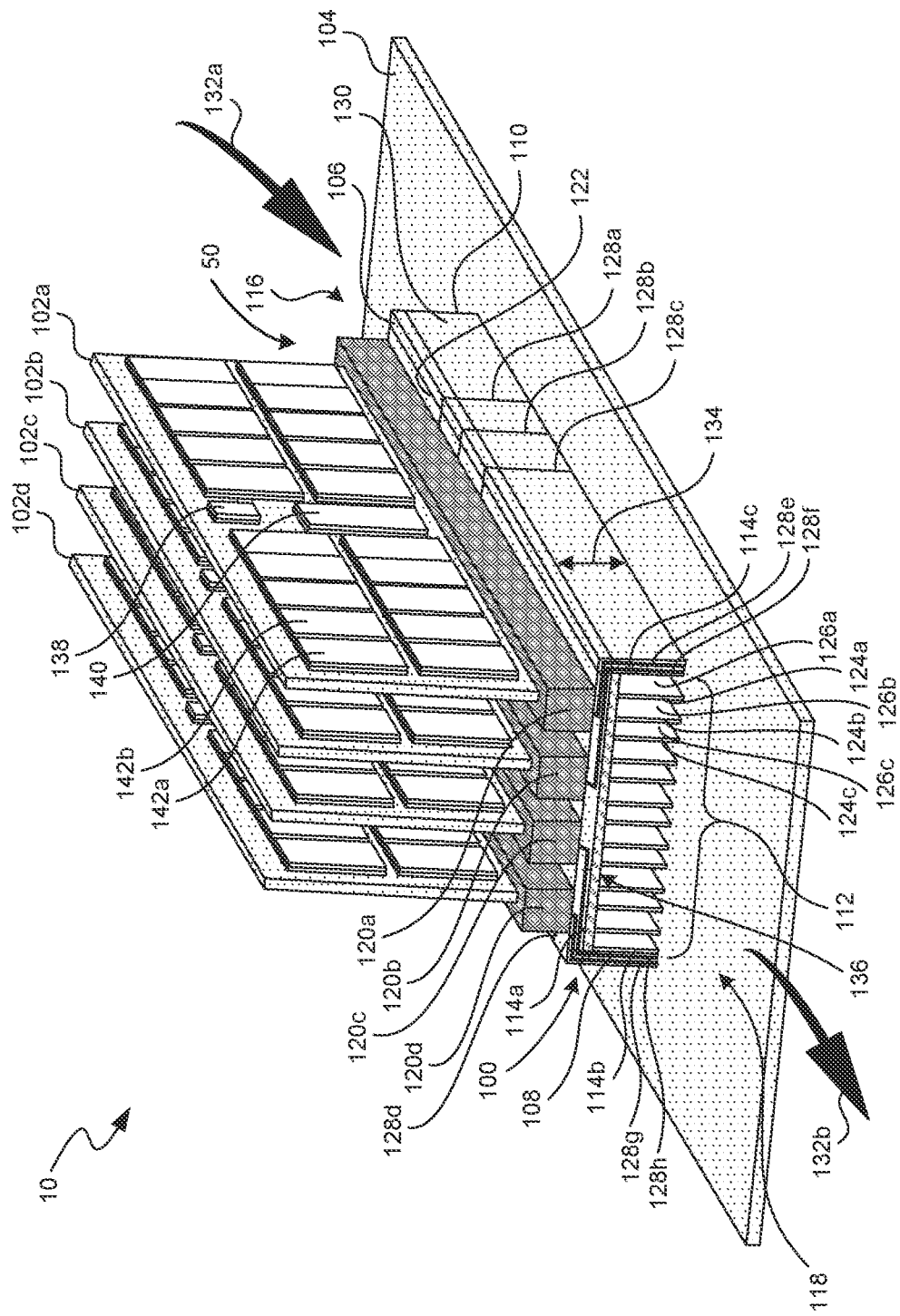
FIG. 1A is an isometric view of a semiconductor component system in accordance with the present technology.

FIG. 1A is an isometric view of a semiconductor component system 10 having semiconductor device daughterboards 102 (identified individually as daughterboards 102a, 102b, 102c and 102d), a motherboard 104, and a circuit board cooling system 50 between the daughterboards 102 and the motherboard 104. The circuit board cooling system 50 can have a heatsink 100 that physically separates the daughterboards 102 and the motherboard 104. The heatsink 100, the daughterboards 102a-d and the motherboard 104 can be used within a system such as a computer, and thus enclosed with other components within a case or housing (not shown). In some embodiments, the daughterboards 102 are memory modules that include one or more of a power management integrated circuit (IC) 138, a logic die 140, multiple memory dies 142 (some of the memory dies are indicated as 142a and 142b), and/or other dies and ICs. In other embodiments one or more of the daughterboards 102 can be separate processor modules (e.g., graphics processors) or combination processor/memory modules. In yet other embodiments, the semiconductor component system 10 can be operated by transmitting signals from the daughterboards 102 to the motherboard 104 when the heatsink 100 separates the daughterboards 102 and the motherboard 104 by a cooling channel (discussed further below).

The components mounted on the semiconductor device daughterboards 102 generate heat that can degrade system performance and/or damage system components if the heat exceeds a predetermined threshold. In some embodiments, there can be one daughterboard 102 or more than four daughterboards 102a-d. In other embodiments, there can be additional heatsinks 100 (not shown) mounted on the motherboard 104, with one or more other daughterboards (not shown) mounted thereon.

The heatsink 100 includes a sub-motherboard 106 attached to sidewalls 108, 110 such that the sub-motherboard 106 is spaced apart from the motherboard 104. Although the sub-motherboard 106 is substantially parallel with the motherboard 104 and the sidewalls 108, 110 are substantially vertical as shown, the sub-motherboard 106 and sidewalls 108, 110 can be mounted at other angles relative to the motherboard 104. The sidewalls 108, 110 are positioned opposite each other and project from, and are mounted to, the motherboard 104. The sub-motherboard 106 can be made of the same material as the motherboard 104, although other materials can be used. In some embodiments FR4 and copper signal layers can be used for the motherboard 104 and the sub-motherboard 106. The heatsink 100 accordingly defines a platform that separates the daughterboards 102a-d from the motherboard 104.

More specifically, a cooling channel 112 is formed between the motherboard 104 and the inner surfaces 114a, 114b, 114c of the sub-motherboard 106 and the sidewalls 108, 110, respectively. The cooling channel 112 has first and second ends 116, 118 through which an airflow 132a, 132b enters and exits the cooling channel 112, respectively. Therefore, the cooling channel 112 has at least one elongated flow path extending between the first and second ends 116, 118.

The heatsink 100 can further include a plurality of fins 124 (identified individually as 124a, 124b and 124c although not all are marked) that extend substantially vertically within the cooling channel 112 and along the length or a portion of the length of the cooling channel 112. One expected advantage of the embodiment shown in FIG. 1A is that the fins 124 provide more surface area for dissipating heat within the cooling channel 112. The heatsink 100 can also have a conducting plate 136 between top ends of the fins 124 and the inner surface 114a of the sub-motherboard 106 to aid in the heat transfer from the semiconductor device daughterboards 102 to the fins 124. In another embodiment, the fins 124 can be attached to at least one of the inner surface 114a of the sub-motherboard 106 and the motherboard 104. Sub-channels 126 (identified individually as 126a, 126b and 126c although not all are marked) are formed between the sidewall 110 and the fin 124a, between the fin 124a and the fin 124b, between the fin 124b and the fin 124c, etc. The fins 124 and the conducting plate 136 can be made substantially of metal, such as copper, aluminum, aluminum alloy, or any other suitable material.

Figure 3:
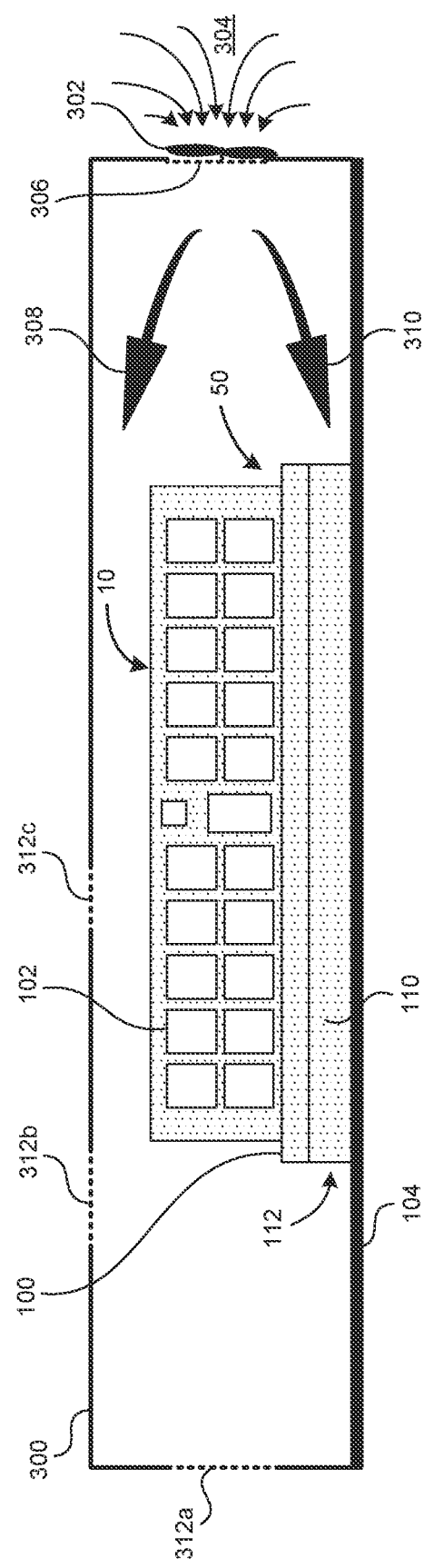
FIG. 3 is a side-view of the semiconductor component system enclosed within a housing in accordance with the present technology.

As discussed further below, a fan (as shown in the embodiment of FIG. 3) can be used to drive the airflow (arrows 132a and 132b) (e.g., cooling medium) through the cooling channel 112. Depending upon the position of the fan, the air can be pushed or pulled through the cooling channel 112. In operation, some of the heat generated by the daughterboards 102 transfers to the heatsink 100. The airflow 132a, 132b passing through the cooling channel 112 cools the fins 124 (i.e., draws heat from the fins 124) to manage the temperature of the daughterboards 102.

The dimensions of the heatsink 100 can be based on the cooling requirements of the system and the space available. For example, a height 134 of the cooling channel 112 can be determined based on the heat generated by the daughterboards 102, the volume and speed of air generated by the fan(s), expected ambient air temperature or cooling air temperature, length of time the system will be operated, or other factors that impact the amount of heat a system can generate.

Providing the cooling channel 112 between the daughterboards 102 and the motherboard 104 can remove heat from the bottom edge of the daughterboards 102 in addition to removing heat directly from the components via the airflow between daughterboards 102. Thus, compared to systems that only remove heat from above and between the daughterboards 102, the cooling system 50 is expected to reduce the operating temperatures of the components.

When the semiconductor device daughterboards 102 are memory modules, the distance, or pitch, between daughterboards 102 can be small, such as approximately 7.6 millimeters (mm). Each of the daughterboards 102 can have high power (e.g., approximately 15 Watts) and generate significant heat. Even when a fan is used to provide cooling between and over the daughterboards 102, the temperature can rise to an unacceptable level and may result in component failure and performance degradation.

The semiconductor component system 10 can further include connectors 120 (identified individually as 120a, 120b, 120c and 120d) mounted to an outer surface 122 of the sub-motherboard 106 to receive and mechanically and electrically connect the daughterboards 102a-d to the heatsink 100. The connectors 120a-d can include a thermally conductive dielectric material such as a thermally conductive plastic or other high-K dielectric material, FR4 or other plastic materials, and electrical contacts. Therefore, the connectors 120a-d can thermally conduct heat from the daughterboards 102a-d to the heatsink 100.

The cooling system 50 can include traces 128 (some traces are identified individually as 128a, 128b, 128c and 128d) formed along an outer surface 130 of the sidewalls 108, 110 and along the sub-motherboard 106 to electrically couple the contacts of the connectors 120 to the motherboard 104. In some embodiments, the traces 128 can be formed along inner surfaces 114b, 114c of the sidewalls 108, 110. In yet further embodiments, the traces 128 (identified individually as 128e, 128f, 128g and 128h) can be formed along outer surfaces and/or within layers of the material and/or embedded in the material of the sub-motherboard 106 and the sidewalls 108, 110.

Figure 1B:
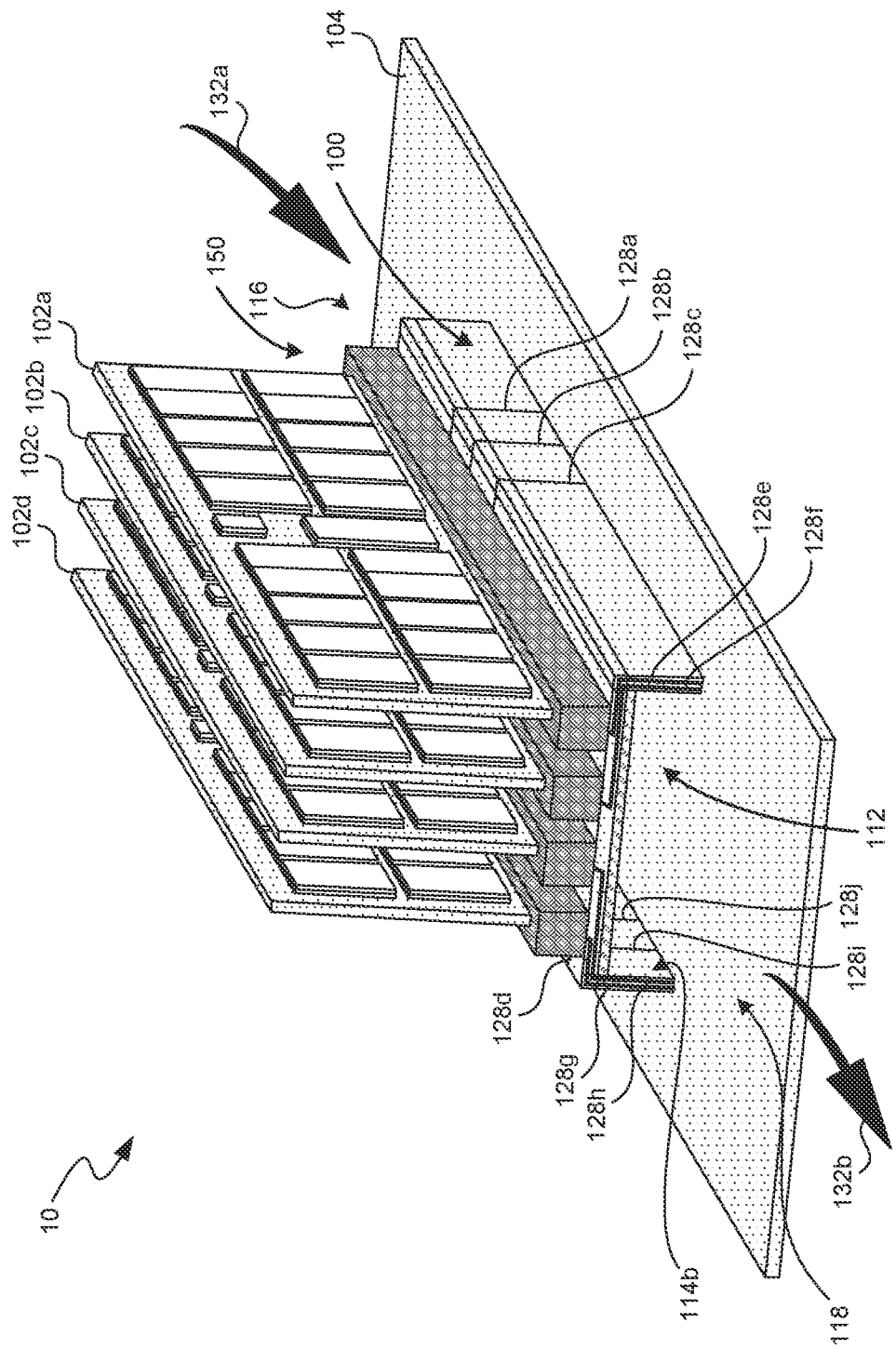
FIG. 1B is an isometric view of another embodiment of the semiconductor component system in accordance with the present technology.

FIG. 1B is an isometric view of the semiconductor component system 10 with another circuit board cooling system 150 in accordance with the present technology. Like reference numbers refer to like components in FIGS. 1A, 1B and 1C, although not all components are indicated on FIGS. 1B and 1C.

The cooling channel 112 of the system 150 is open and does not include the fins 124 as shown in FIG. 1A. As a result, the airflow 132 passes through the cooling channel 112, such as through the opening that extends from the first end 116 of the cooling channel 112 to the second end 118 of the cooling channel 112 as discussed with respect to FIG. 1A. The airflow 132 in the cooling channel 112 dissipates some of the heat from the heatsink 100 to manage the temperature of the components on the daughterboards 102.

As with FIG. 1A, the traces 128a-h are illustrated. In addition, traces 128i and 128j are shown on the inner surface 114b of the heatsink 100. Therefore, in some embodiments, some or all of the traces 128a-j can electrically couple the contacts of the connectors 120 to the motherboard 104.

Figure 1C:
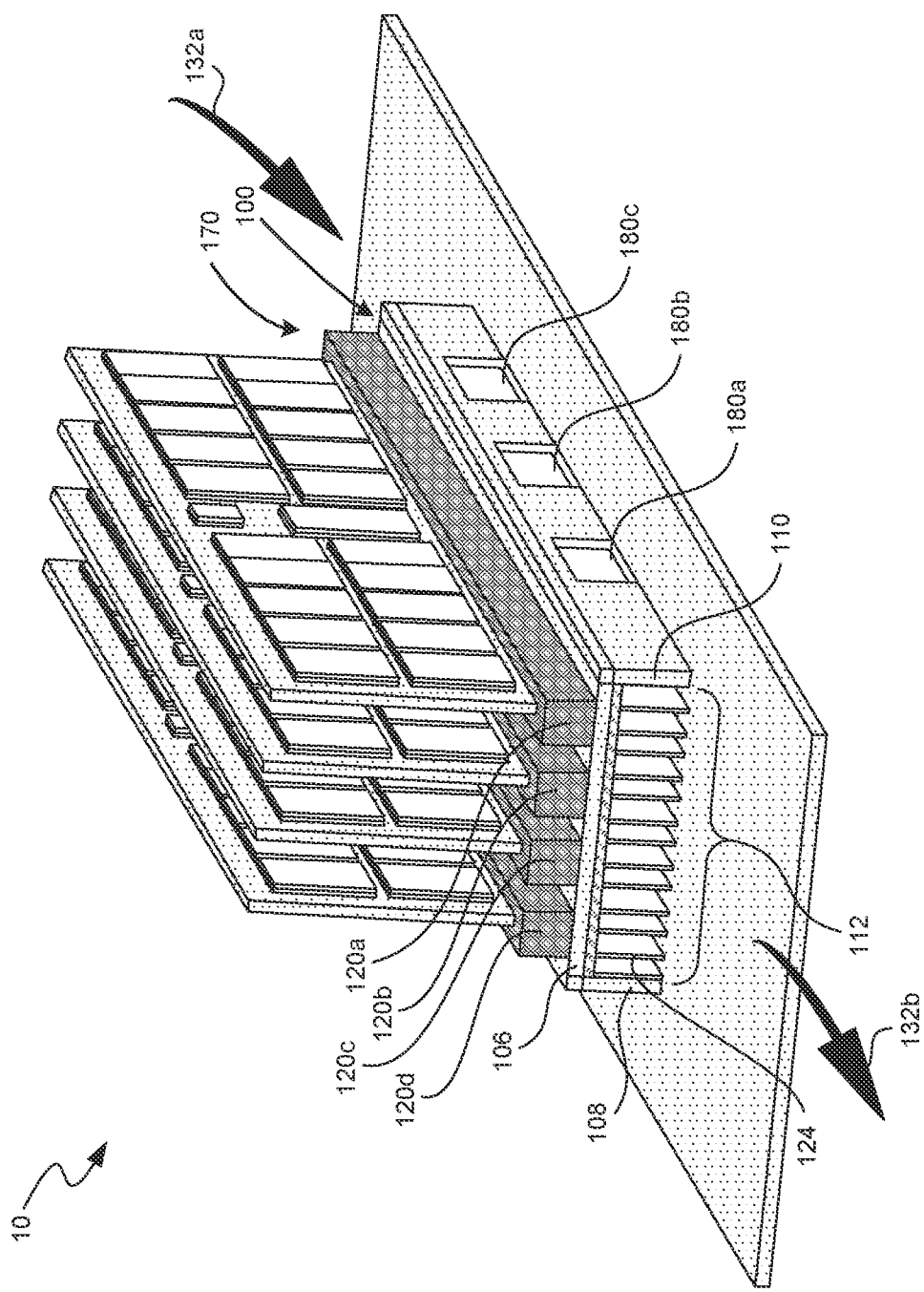
FIG. 1C is an isometric view of yet another embodiment of the semiconductor component system in accordance with the present technology.

FIG. 1C shows the semiconductor component system 10 with another embodiment of a circuit board cooling system 170 in accordance with the present technology. In this embodiment, the sidewalls 108 and 110 have one or more openings 180 (shown as 180a, 180b and 180c in sidewall 110). More or fewer openings 180 can be used and their placement along the sidewalls 108 and 110 is not limited to the positions shown. As a result, ambient air outside the heatsink 100 can enter through the openings 180 to mix with the air passing through the cooling channel 112 and/or air within the cooling channel 112 can exit the heatsink 100 through the openings 180. The size of the openings 180 may be determined by system cooling requirements. In some embodiments, some of the sidewalls 108, 110 can have one or more openings 180 while other sidewalls may be solid. The fins 124 are shown in FIG. 1C, but in another embodiment the cooling channel 112 of FIG. 1C can be open without fins as shown in FIG. 1B.

Figure 2:
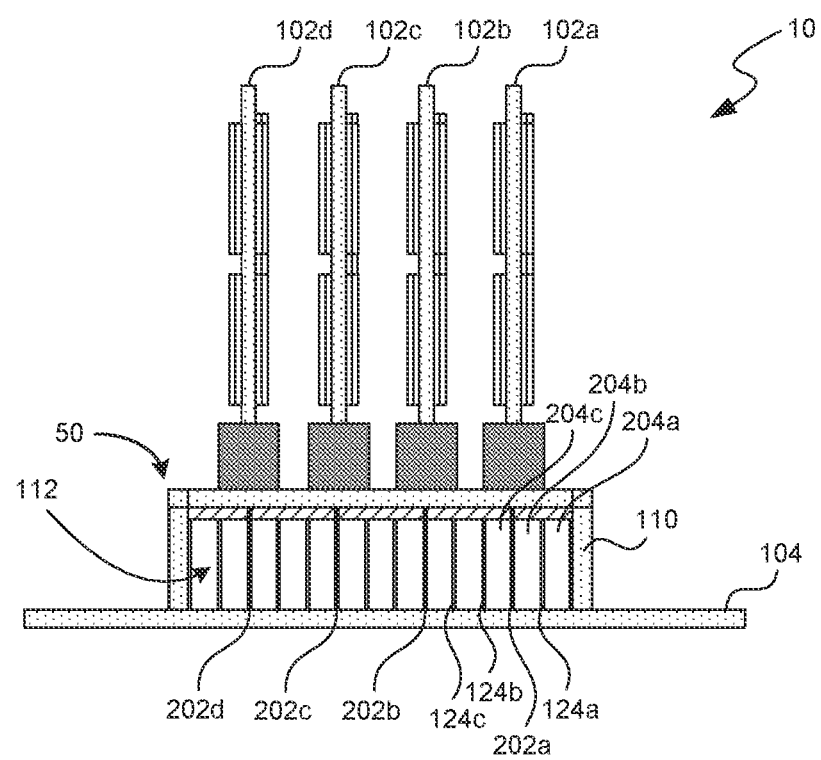
FIG. 2 is an end view of the semiconductor component system having an embodiment of the cooling system shown in FIG. 1A in accordance with the present technology.

FIG. 2 is an end view of a semiconductor component system 10 having an embodiment of the cooling system 50 (FIG. 1A) in accordance with the present technology. As discussed above in FIG. 1A, traces that connect the daughterboards 102 with the motherboard 104 can extend through the cooling channel 112 either in addition to or in lieu of the traces 128 shown in FIG. 1A. For example, trace circuit boards 202 (identified individually as 202a, 202b, 202c and 202d) can be positioned in the cooling channel 112 in the place of some of the fins 124. In some embodiments the trace circuit boards 202 can have trace lines integral with (e.g., formed on and/or within) a substrate made of FR4 although other materials can be used. As shown, each of the daughterboards 102 can have a corresponding trace circuit board 202. In another embodiment, one of the trace circuit boards 202 may convey the signals of more than one of the daughterboards 102.

In some embodiments, the cooling system 50 can have fins 124 in the cooling channel 112 interspersed with the trace circuit boards 202. Therefore, sub-channels can be formed between adjacent items within the cooling channel 112. For example, sub-channel 204a is formed between the sidewall 110 and the fin 124a, sub-channel 204b is formed between the fin 124a and the trace circuit board 202a, and sub-channel 204c is formed between the trace circuit board 202a and the fin 124b.

In operation, as the cooling air moves through the cooling channel 112 to the other end, the air passes through the sub-channels 204 along the fins 124 and the trace circuit boards 202. The air within the cooling channel 112 withdraws heat from the fins 124 and the trace circuit boards 202 to manage the temperature of the components on the daughterboards 102.

In another embodiment, only the trace circuit boards 202 can be mounted within the cooling channel 112. In this configuration, no other cooling fins are within the cooling channel 112. As a result, sub-channels are formed between one of the sidewalls and an adjacent trace circuit board 202 and between adjacent trace circuit boards 202. Again, air passing through the sub-channels in the cooling channel 112 will withdraw heat from the trace circuit boards 202 to manage the temperature of the components on the daughterboards 102.

FIG. 3 shows a side-view of the semiconductor component system 10 enclosed within a housing 300 in accordance with the present technology. The sidewall 110 of the heatsink 100 is indicated with dots. In many cases, multiple circuit board cooling systems 50 can be enclosed within the housing 300. For example, multiple heatsinks 100 can be mounted on the motherboard 104, and each heatsink 100 can connect one or more daughterboards 102 to the motherboard 104.

A fan 302 can be mounted within the housing 300 or outside the housing 300 as shown. The fan 302 blows ambient air 304 through an air inlet 306 into the housing 300. A portion of the airflow passes along the daughterboard 102 (arrow 308), while another portion of the airflow passes through the cooling channel 112 (arrow 310). The upper portion of the airflow (arrow 308) passes between adjacent daughterboards 102, as well as between adjacent heatsinks 100. The housing 300 has one or more air outlets 312 (indicated as 312a, 312b and 312c) or vents through which heated air exits the housing 300. One expected advantage of the embodiments shown in FIGS. 1-3 is that by providing the open channel 112 between the motherboard 104 and the daughterboards 102 airflow passes under the daughterboards 102 to further remove heat from the components. This may lower the temperature for all components within the housing.

Figure 4:
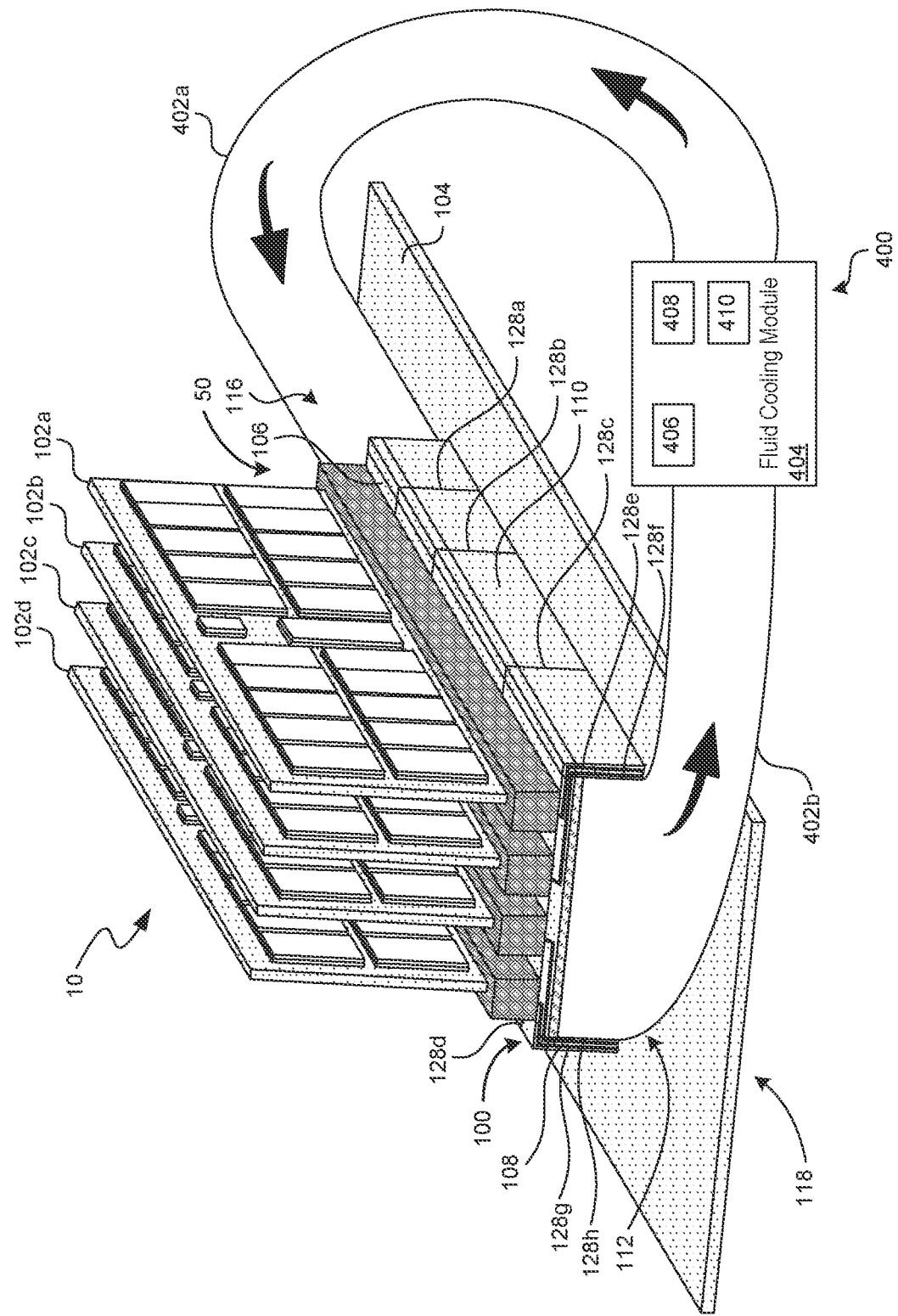
FIG. 4 is an isometric view of the semiconductor component system that uses a closed-circuit cooling system in accordance with the present technology.

FIG. 4 is an isometric view of the semiconductor component system 10 that uses a closed-circuit cooling system 400 with the circuit board cooling system 50 in accordance with the present technology. Like reference numbers refer to like components in FIGS. 1A, although not all components are indicated on FIG. 4. The heatsink 100 includes the sub-motherboard 106 and sidewalls 108, 110 that form the cooling channel 112. The heatsink 100 can have fins within the cooling channel 112 like fins 124 shown in FIG. 1A, or the cooling channel 112 can be free of fins like FIG. 1B. The traces 128a-h or other traces (not shown) on or within the material of the heatsink 100 can provide electrical connection and communication between the daughterboards 102 and the motherboard 104.

The cooling system 400 can be a closed system that drives a cooling fluid through the heatsink 100. The cooling system 400 can have a cooling module 404 and a fluid containment system 402a, 402b, such as a pipe, hose or other enclosed component that conveys cooling fluid from the fluid cooling module 404 and through the cooling channel 112. The fluid containment system 402 prevents the cooling fluid from contacting the heatsink 100 and motherboard 104.

The temperature of the cooling fluid entering the cooling channel 112 can be lower than the temperature within the cooling channel 112. As the cooling fluid moves through the cooling channel 112, the temperature of the cooling fluid rises. In some embodiments, the fluid cooling system 400 can be a two-phase system such that when the cooling fluid exits the cooling channel 112, the temperature of the cooling fluid has risen to its vapor point and by the time it re-enters the first end 116 it has condensed back to a liquid state.

The fluid cooling module 404 can be mounted on or near the motherboard 104 or can be external to the motherboard 104. The fluid cooling module 404 can include a pump mechanism 406 to circulate the cooling fluid through the fluid containment system 402 and a cooling mechanism 408 that cools the cooling fluid to a lower temperature or a predetermined temperature prior to recirculating the cooling fluid through the fluid containment system 402. In some embodiments fluid cooling module 404 can also have a reservoir 410 to hold cooling fluid until it is at a desirable temperature or to mix the returned cooling fluid with lower temperature cooling fluid.

Figure 5:
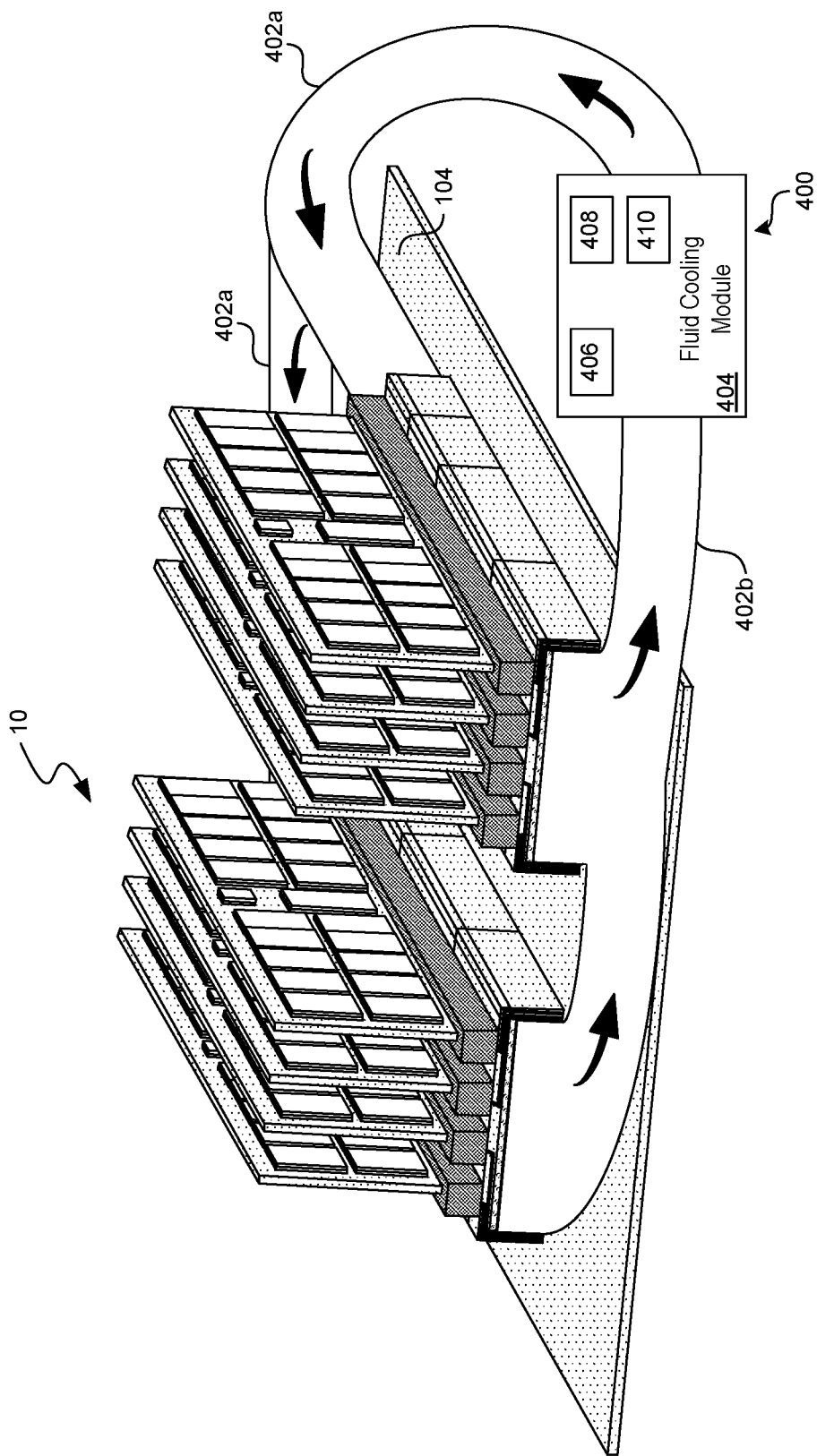
FIG. 5 is an isometric view of the semiconductor component system that uses a closed-circuit cooling system in accordance with another embodiment of the present technology

Although only one heatsink 100 is shown connected to the fluid cooling module 404, in other embodiments, the fluid cooling module 404 can be configured to provide the cooling fluid to a plurality of heatsinks 100 simultaneously. For example, multiple heatsinks 100 can be aligned on the motherboard 104 so that their respective cooling channels 112 are aligned. A single fluid containment system 402 may convey cooling fluid through more than one cooling channel 112 prior to returning the cooling fluid to the fluid cooling module 404. In other configurations, as illustrated in FIG. 5, a fluid containment system can have a manifold that splits the fluid flow into multiple branches 402a, 402b that are fluidly connected to convey cooling fluid through multiple cooling channels 112 of multiple heatsinks 100.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor component system, comprising:
   a motherboard;
   a closed-circuit cooling system mounted to the motherboard, the cooling system including:
      a first cooling channel over the motherboard, the first cooling channel defined by first sidewalls projecting from the motherboard, and a first sub-motherboard extending between the first sidewalls and spaced apart from the motherboard,
      a second cooling channel over the motherboard, the second cooling channel defined by second sidewalls projecting from the motherboard, and a second sub-motherboard extending between the second sidewalls and spaced apart from the motherboard,
      a cooling module including a pump to circulate cooling fluid through the closed-circuit cooling system and a cooling mechanism configured to lower a temperature of the cooling fluid;
      an enclosed fluid containment component configured to convey the cooling fluid from the cooling module to the first and second cooling channels and back;
   a first connector attached to the first sub-motherboard and configured to receive a first semiconductor device daughterboard, wherein the first connector has first contacts to electrically couple the first semiconductor device daughterboard to the first sub-motherboard; and
   a second connector attached to the second sub-motherboard and configured to receive a second semiconductor device daughterboard, wherein the second connector has second contacts to electrically couple the second semiconductor device daughterboard to the second sub-motherboard.

2. The system of claim 1, wherein the first cooling channel further comprises:
   traces extending along the first sub-motherboard and the first sidewalls to electrically couple the first connector to the motherboard.

3. The system of claim 2, wherein the traces are formed along outer surfaces of the first sidewalls and the first sub-motherboard.

4. The system of claim 2, wherein the traces are formed along inner surfaces of the first sidewalls and the first sub-motherboard.

5. The system of claim 2, wherein the traces are formed within layers of the first sidewalls and the first sub-motherboard.

6. The system of claim 2, further comprising at least one trace circuit board extending through the first cooling channel between the first sub-motherboard and the motherboard, the traces being formed integral with the trace circuit board.

7. The system of claim 1, wherein the cooling module is configured to condense the cooling fluid from a vapor state to a liquid state.

8. The system of claim 1, wherein the first connector comprises a thermally conductive dielectric.

9. A semiconductor component system, comprising:
   a motherboard;
   a heatsink configured to physically separate at least one semiconductor device daughterboard from the motherboard by a cooling channel between the semiconductor device daughterboard and the motherboard, the heatsink comprising at least one opening extending from a first end of the cooling channel to a second end of the cooling channel for conveying a cooling fluid between the motherboard and the semiconductor device daughterboard;
   a cooling module including a pump to circulate cooling fluid through the cooling channel and a cooling mechanism configured to lower a temperature of the cooling fluid;
   an enclosed fluid containment component configured to convey the cooling fluid from the cooling module to the cooling channel and back;
   a connector attached to the heatsink and configured to receive the semiconductor device daughterboard, wherein the connector has contacts to electrically couple the semiconductor device daughterboard to the heatsink; and
   a second heatsink configured to physically separate at least a second semiconductor device daughterboard from the motherboard by a second cooling channel between the semiconductor device daughter board and the motherboard, the second heatsink comprising at least one opening extending from a first end of the second cooling channel to a second end of the second cooling channel for conveying the cooling fluid between the motherboard and the second semiconductor device daughterboard.

10. The system of claim 9, further comprising at least one trace circuit board extending through the cooling channel to electrically couple the contacts of the connector to the motherboard.

11. The system of claim 10, further comprising a plurality of fins in the cooling channel and a conducting plate in the cooling channel between the plurality of fins and the heatsink, the conducting plate and the plurality of fins being formed of metal.

12. The system of claim 9, wherein the heatsink further comprises:
   two sidewalls attached to the motherboard;
   a sub-motherboard extending between the sidewalls, and the connector being mounted to the sub-motherboard; and
   traces electrically coupling the connector and the motherboard, the traces extending along at least one of outer surfaces, inner surfaces, and within layers of the sidewalls and the sub-motherboard.

13. The system of claim 12, further comprising:
   a second connector attached to the heatsink and configured to receive a third semiconductor device daughterboard, wherein the second connector has second contacts to electrically couple the third semiconductor device daughterboard to the heatsink; and
   second traces electrically coupling the second connector and the motherboard, the second traces extending along at least one of outer surfaces, inner surfaces, and within layers of the sidewalls, the traces and the second traces formed separately with respect to each other.

14. The system of claim 9, wherein the connector comprises a thermally conductive dielectric.

15. The system of claim 9, wherein the cooling module is configured to condense the cooling fluid from a vapor state to a liquid state.

\* \* \* \* \*